US012800619B2

(12) United States Patent
Mertens

(10) Patent No.: US 12,800,619 B2
(45) Date of Patent: Nov. 17, 2026

(54) CURRENT COMPARATOR USABLE IN DC-DC CONVERTER APPLICATIONS

(71) Applicant: NXP B.V., Eindhoven (NL)

(72) Inventor: Robert Matthew Mertens, Crystal Lake, IL (US)

(73) Assignee: NXP B.V., Eindhoven (NL)

( * ) Notice: Subject to any disclaimer, the term of this patent is extended or adjusted under 35 U.S.C. 154(b) by 197 days.

(21) Appl. No.: 18/591,341

(22) Filed: Feb. 29, 2024

(65) Prior Publication Data

US 2025/0277824 A1 Sep. 4, 2025

(51) Int. Cl.
*G01R 19/00* (2006.01)
*H02M 1/00* (2007.01)
(Continued)

(52) U.S. Cl.
CPC ...... *G01R 19/0038* (2013.01); *H02M 1/0003* (2021.05); *H02M 1/0009* (2021.05); *H02M 1/088* (2013.01); *H02M 3/158* (2013.01); *H03K 5/2481* (2013.01); *H03M 1/129* (2013.01); *H02M 1/08* (2013.01); *H02M 3/1588* (2013.01); *H03F 3/217* (2013.01); *H03F 2200/78* (2013.01); *H03K 5/08* (2013.01); *H03M 1/1009* (2013.01); *H03M 1/466* (2013.01)

(58) Field of Classification Search
CPC ............ G01R 19/0038; H02M 1/0009; H02M 3/158; H02M 1/0003; H02M 1/088; H03K 5/2481; H03F 2200/78; H03F 3/217
USPC ...................................................... 324/140 R
See application file for complete search history.

(56) References Cited

U.S. PATENT DOCUMENTS 5,065,045 A 11/1991 Mok
5,838,200 A 11/1998 Opris
(Continued)

FOREIGN PATENT DOCUMENTS

JP 2013038549 A 2/2013
WO WO-2016122913 A1 * 8/2016 ............ H03M 1/129

OTHER PUBLICATIONS

EECS 247 Lecture 21, Nyquist Rate ADC: Comparator Design, 2007, pp. 1-30.
(Continued)

*Primary Examiner* — Alesa Allgood
*Assistant Examiner* — Hugo Navarro
(74) *Attorney, Agent, or Firm* — Joanna G. Geld

(57) ABSTRACT

A current comparator includes a first capacitor having a first terminal coupled to a first input signal, a second capacitor having a first terminal coupled to a second input signal, a first transistor having a control electrode coupled to a second terminal of the first capacitor, and a third transistor having a control electrode coupled to a second terminal of the second capacitor. First current electrodes of the first and second transistors are coupled, and second current electrodes of the first and second transistors are coupled to first and second circuit nodes, respectively. A single-ended cascode amplifier has an input coupled via a third capacitor to the second circuit node. A set of auto-zero switches, in response to an auto-zero control signal, selectively shorts the control electrode and second current electrode of the first transistor and selectively shorts the control electrode and the second current electrode of the second transistor.

18 Claims, 7 Drawing Sheets

(51) Int. Cl.

| | |
|---|---|
| ***H02M 1/08*** | (2006.01) |
| ***H02M 1/088*** | (2006.01) |
| ***H02M 3/158*** | (2006.01) |
| ***H03F 3/217*** | (2006.01) |
| ***H03K 5/08*** | (2006.01) |
| ***H03K 5/24*** | (2006.01) |
| ***H03M 1/10*** | (2006.01) |
| ***H03M 1/12*** | (2006.01) |
| ***H03M 1/46*** | (2006.01) |

(56) References Cited

U.S. PATENT DOCUMENTS

| | | | | |
|---|---|---|---|---|
| 7,928,719 B2 | 4/2011 | Zhang et al. | | |
| 10,498,322 B1 | 12/2019 | Ebihara | | |
| 10,778,080 B1 * | 9/2020 | Mednik | H02M 1/08 | |
| 2013/0215302 A1 * | 8/2013 | Ueno | H03K 5/08 | 348/300 |
| 2015/0280561 A1 * | 10/2015 | Berens | H02M 3/1588 | 323/271 |
| 2018/0091752 A1 * | 3/2018 | Ebihara | H03K 5/2481 | |
| 2018/0109744 A1 * | 4/2018 | Hanzawa | H03K 5/08 | |
| 2018/0254779 A1 * | 9/2018 | Omran | H03M 1/1009 | |
| 2020/0014395 A1 * | 1/2020 | Chaput | H03M 1/466 | |

OTHER PUBLICATIONS

Enne et al.: "An integrated low power buck converter with a comparator controlled low-side switch," 13th IEEE Symposium on Design and Diagnostics of Electronic Circuits and Systems, Apr. 14-16, 2010, DOI: 10.1109/DDECS.2010.5491813, Vienna, Austria, pp. 84-87.

Michal: "Inductor Current Zero-Crossing Detector and CCM/DCM Boundary Detector for Integrated High-Current Switched-Mode DC-DC Converters," IEEE Transactions on Power Electronics, vol. 29, No. 10, Oct. 2014, pp. 5384-5391.

* cited by examiner

CURRENT COMPARATOR USABLE IN DC-DC CONVERTER APPLICATIONS

BACKGROUND

Field

This disclosure relates generally to integrated circuits, and more specifically, to a current comparator usable in DC-DC converter applications.

Related Art

Direct current (DC)-direct current (DC) converters typically need to sense the current in the power transistors so as to avoid exceeding maximum current ratings or to sense when the inductor current crosses zero so as to support discontinuous conduction mode (DCM) operation. Therefore, a need exists for improved comparators capable of sensing such thresholds with improved precision while maintaining power conversion efficiency.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a current comparator (also referred to as a threshold comparator) is provided which can implement a ZC comparator to indicate when the inductor current of a DC-DC converter crosses zero. In this manner, DCM operation of the DC-DC converter can be supported. The current comparator can also implement an OC comparator to indicate when the inductor current exceeds a maximum current rating. The current comparator includes a first stage (i.e. a differential stage) with input capacitors configured to store offsets and power switches which enable auto-zeroing. The current comparator also includes a second stage including one or more single-ended cascode amplifiers in a cascaded configuration, each with a DC blocking capacitor on the input as well as a capacitor to store the cascode transistor's gate bias voltage and accompanying power switches to support auto-zeroing. The current comparator may also include output logic gages to convert the last single-ended cascode amplifier's analog output to a digital signal.

Figure 1:
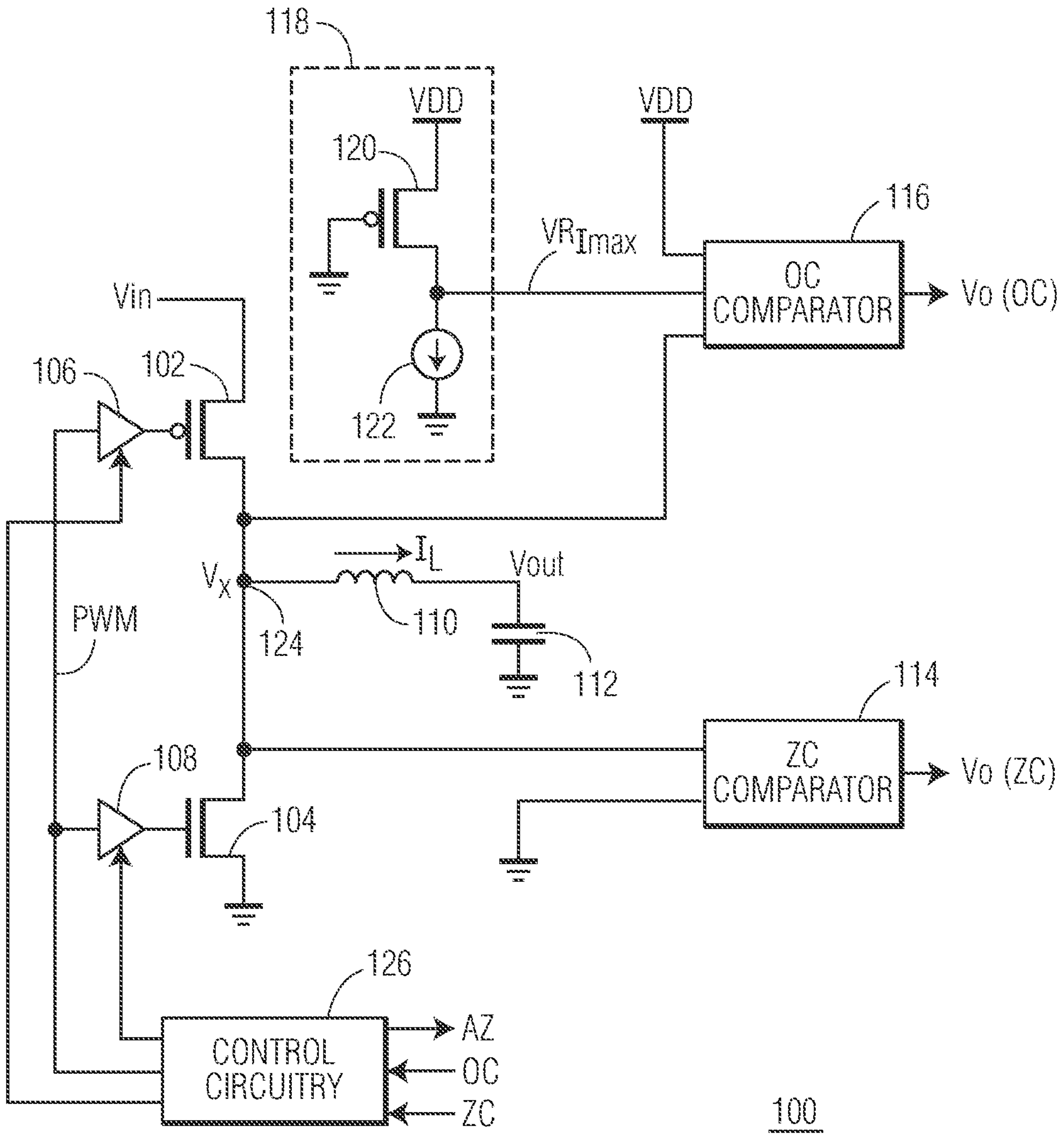
FIG. 1 illustrates a DC-DC buck converter having an over-current (OC) comparator and a zero-crossing (ZC) comparator, in accordance with one embodiment of the present invention.

FIG. 1 illustrates, in partial block diagram and partial schematic form, a DC-DC converter 100 having an over-current (OC) comparator 116 (which may also be referred to as an OC detector or an OC condition detector) and a zero-crossing (ZC) comparator 114 (which may also be referred to as a ZC detector or a ZC condition detector), in accordance with one embodiment of the presents invention. DC-DC converter 100 is configured as a buck or step-down DC-DC converter which decreases voltage while increasing current from its input (Vin) to its output (load). In the illustrated embodiment, converter 100 is a switching converter, with power switches 102 and 104, implemented as a p-channel metal-oxide semiconductor (PMOS) transistor and n-channel metal-oxide semiconductor (NMOS) transistor, respectively. Such switching converters typically provide for greater power efficiency as compared to linear regulators (which do not typically step up output current). (Note that, in alternate embodiments, each power switch can be implemented with multiple transistors, in which the power switches may be referred to collectively as the power stage of DC-DC converter 100.) In addition to the power stage (e.g. power switches 102 and 104), converter 100 includes energy storage elements inductor 110 and capacitor 112. In the illustrated embodiment, a first current electrode of PMOS transistor 102 is coupled to receive an input voltage, Vin, and a second current electrode is coupled to a first circuit node 124 at a first terminal of inductor 110. The voltage at circuit node 124 is labeled Vx (corresponding to a voltage at a first internal node of the power stage of converter 100). In one embodiment, Vin may be coupled to a first voltage supply terminal configured to provide a first supply voltage, Vdd. A first current electrode of NMOS transistor 104 is coupled circuit node 124 and the second current electrode of transistor 102, and has a second current electrode coupled to a second voltage supply terminal configured to supply a second supply voltage, Vss, in which Vdd is greater than Vss. In one embodiment, Vss is ground, such as, e.g., a local AC ground. Note that, as used herein, the first and second voltage supply terminals may simply be referred to by the supply voltage provided by the terminal (e.g. as Vdd and Vss, respectively). A second terminal of inductor 110 is coupled to a first terminal of capacitor 112 and provides an output voltage, Vout, of the converter, and a second terminal of capacitor 112 is coupled to Vss. A control electrode of transistor 102 is coupled to an output of a first driver 106, and a control electrode of transistor 104 is coupled to an output of a second driver 108.

In the illustrated embodiment, an input of driver 106 and an input of driver 108 are each coupled to receive a digital input signal, such as a pulse-width modulated (PWM) signal which controls transistors 102 and 104 (also referred to as switches or power switches) to be in an on-state (in which transistor 102 is on while transistor 104 is off) or an off-state (in which transistor 102 is off but transistor 104 is on). That is, the PWM signal results in transistors 102 and 104 being alternately on and off. Note that in alternate embodiments, different digital signals may be used for drivers 106 and 108 to control the on and off states of each of transistors 106 and 108 and thus control the generation of Vx. In one embodiment, the PWM may be provided by control circuitry 126. Alternatively, it can be provided by circuitry outside converter 100.

In continuous conduction mode (CCM) operation, the current through inductor 110 (indicated by the arrow labeled $I_L$) is controlled by power switches 102 and 104, as known in the art, in which Vx at node 124 forms a square wave between a high voltage and a low voltage, in which the high voltage is between Vdd and the low voltage and the low voltage normally slightly below Vss (alternatively, it may be slightly above Vss if the converter permits $I_L$ to be negative). For example, while in the on-state (during a low phase of the PWM signal which causes transistor 102 to be on but 104 to be off), Vx is at the high voltage in which $I_L$ increases as inductor 110 charges, and while in the off-state (during a high phase of the PWM signal which causes transistors 102 to be off and 104 on), Vx is at the low voltage in which $I_L$ decreases as inductor 110 discharges. In this manner, Vout is provided as an average level of Vx, between the high and low voltages of Vx, in which the LC filter formed by inductor 110 and capacitor 112 operates to flatten out Vout.

While in the on-state, if inductor 110 saturates, $I_L$ may increase to a level beyond a maximum current rating of the inductor (referring to as $I_{max}$). If this happens, the buck converter may fail to operate correctly and can result in a reliability problem for the buck converter or any load driven by the buck converter. Therefore, as will be described below, OC comparator 116 is coupled circuit node 124 in order to monitor current through transistor 102 which corresponds to $I_L$ through inductor 110 (since transistor 104 is off during the on-state). When $I_L$ surpasses the predetermined maximum current, $I_{max}$, OC at the output of OC comparator 116 is asserted. OC can be provided to control circuitry 126 which disables (i.e. turns off) transistor 102 in response to assertion of OC (i.e. in response to OC indicating an over-current condition for $I_L$). That is, so long as an OC condition exists, control circuit 126 can maintain transistor 102 disabled. OC comparator 116 can be implemented using a current comparator which will be described below in reference to FIG. 2.

When converter 100 operates in continuous conduction mode, one of the two power switches is always on, so $I_L$ is always rising or falling. However, in some cases, it may be preferable to disable both power switches at some times. For example, if the power required by the load is very small, it may be less efficient to operate in CCM with $I_L$ swinging between positive and negative currents each cycle than it would be to operate in DCM. In DCM, first transistor 102 is turned on to increase $I_L$, then transistor 102 is turned off and transistor 104 is turned on so that $I_L$ decreases, and when $I_L$ reaches zero, transistor 104 is turned off, causing node Vx 124 to become high impedance (Z) and follow the voltage on Vout. With the same average $I_L$, the DCM will have lower RMS current than the CCM, and will often make converter 100 more efficient. As a second example, converter 100 might have an optimum efficiency at a specific output current in CCM. If such an optimum current exists, when the load current is below the optimum current, it may be most efficient to alternatively drive a current burst at the optimal output current and let $I_L$ idle at zero so that the converter's output current matches the current drawn by the load. In both examples, to avoid dissipating energy stored in inductor 110, transistor 102 is kept on until $I_L$ decreases to zero, and then disabled right when $I_L$ reaches zero. Therefore, in either example, it is necessary to monitor $I_L$ to accurately determine when $I_L$ reaches zero. In one embodiment, ZC comparator 114 is coupled to node 124 in order to monitor $I_L$ and assert ZC when $I_L$ reaches zero. ZC can also be provided to control circuitry 126 which disables (i.e. turns off) transistor 104 in response to assertion of ZC (i.e. in response to ZC indicating a zero crossing condition for $I_L$). Transistor 104 can therefore be maintained off until the next on-state. ZC comparator 114 can also be implemented using the current comparator which will be described below in reference to FIG. 2.

Figure 2:
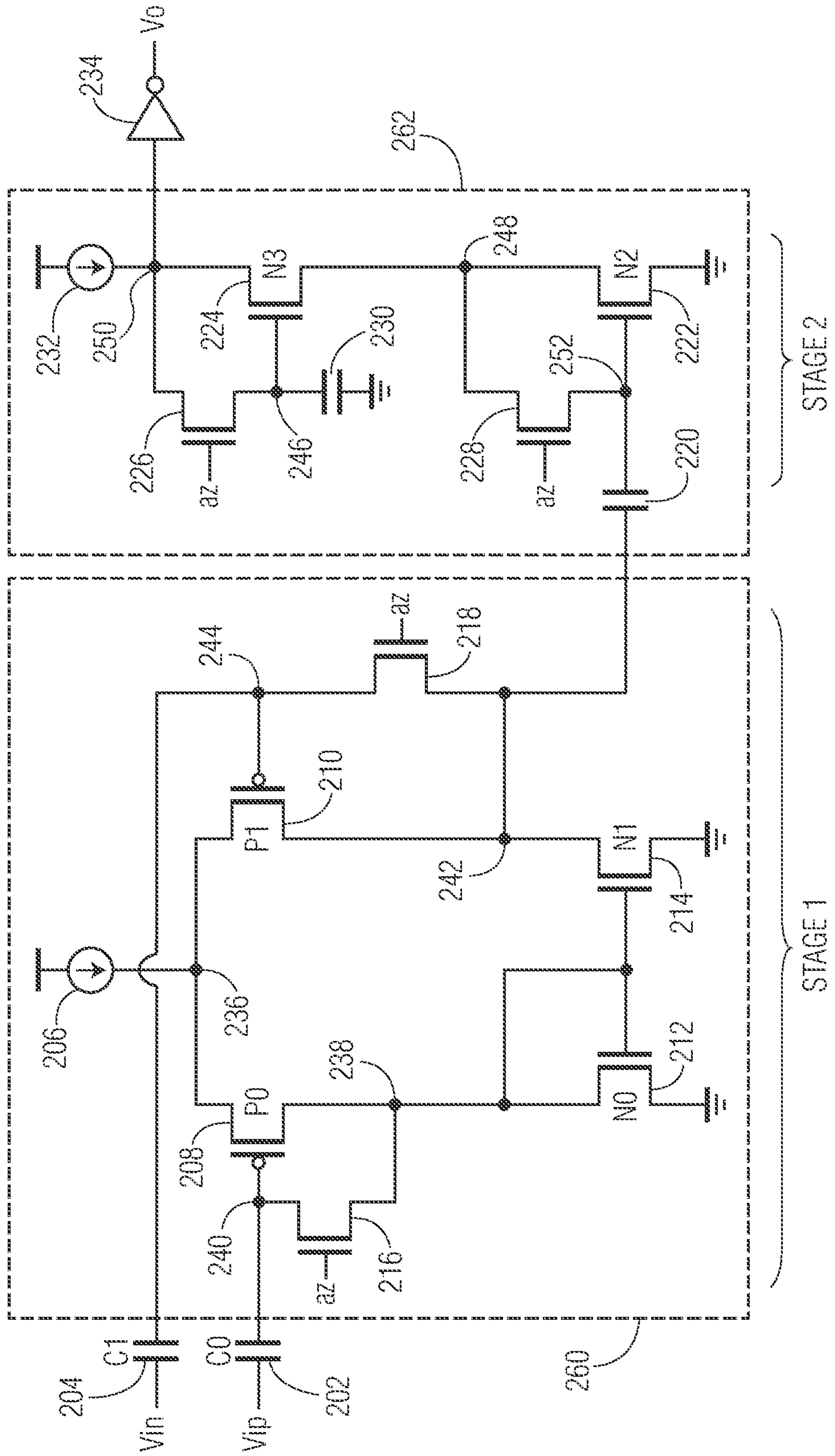
FIG. 2 illustrates a current comparator, responsive to an auto-zero (AZ) control signal, which can be implemented by the OC comparator or ZC comparator of FIG. 1, in accordance with one embodiment of the present invention.

FIG. 2 illustrates, in partial block diagram and partial schematic form, a current comparator 200 which can be used to implement each of ZC comparator 114 and OC comparator 116, in accordance with one embodiment of the present invention. Comparator 200 includes a first input Vip and a second input Vin, in which Vip and Vin are coupled as inputs to a differential stage of comparator 200 (corresponding to Stage 1 of FIG. 2). The differential stage of comparators 200 includes an input capacitor C0 202 (which may simply be referred to as C0 herein) having a first terminal coupled to receive Vip and a second input capacitor C1 204 (which may simply be referred to as C1 herein) having a first terminal coupled to receive Vin. The differential stage also includes a differential amplifier 260 in which a second terminal of C0 is coupled to a non-inverting (+) input of differential amplifier 260 and a second terminal of C1 is coupled to an inverting (−) input of differential amplifier 260. Differential amplifier 260 includes a current source 206, PMOS transistors P0 208 and P1 210 and NMOS transistors N0 212 and N1 214. Note that these PMOS and NMOS transistors may simply be referred to as P0, P1, N0, and N1, respectively. Differential amplifier 260 (implemented in the illustrated embodiment as a common-source amplifier) also includes NMOS transistors 216 and 218, each having a control electrode coupled to receive an auto-zero (AZ) control signal (which may simply be referred to as AZ). Comparator 200 also includes a cascode amplifier 262 (corresponding to Stage 2 of FIG. 2) coupled to an output of differential amplifier 260, and an inverter 234 having an input coupled to an output of cascode amplifier 262 and an output coupled to provide an output Vo. In the illustrated embodiment, Vo is provided by inverter 234 as a digital logic signal.

In differential amplifier 260, a current source 206 is coupled between Vdd and circuit node 236. A first current electrode (e.g. source) of P0 is coupled to circuit node 236, a control electrode of P0 is coupled to the second terminal of C0, and a second current electrode (e.g. drain) of P0 is coupled to a circuit node 238. A first current electrode (e.g. source) of P1 is coupled to node 236, a control electrode of P1 is coupled to the second terminal of C1, and a second current electrode (e.g. drain) of P1 is coupled to a circuit node 242. A first current electrode (e.g. drain) of N0 and a control electrode of N0 are coupled to node 238, a second current electrode (e.g. source) of N0 is coupled to Vss. A first current electrode (e.g. drain) of N1 is coupled to node 242, a control electrode of N1 is coupled to the control electrode of N0, and a second current electrode (e.g. source) of N1 is coupled to Vss.

Control switches (e.g. transistors 216 and 218) of differential amplifier 260 are coupled between the gate and drains of P0 and P1 to selectively short the gate to drains based on the value of AZ. Transistor 216 has a first current electrode coupled to the control electrode of P0 at a circuit node 240, a second current electrode coupled to the second current electrode (e.g. drain) of P0 at node 238, and a control electrode coupled to receive AZ. Transistor 218 has a first current electrode coupled to the control electrode of P1 at a circuit node 244, a second current electrode coupled to the second current electrode of P1 at node 242, and a control electrode coupled to receive AZ. Therefore, when AZ is asserted to a logic level one, the gates of P0 and P1 are each shorted to their corresponding drains. When AZ is negated to a logic level 0, transistors 216 and 218 are off, in which the gates of P0 and P1 are no longer shorted to their corresponding drains.

Cascode amplifier 262 includes a current source 232, capacitors 230 and 220, and NMOS transistors N2 222 and N3 224 (which may simply be referred to as N2 and N3, respectively). Cascode amplifier 262 also includes NMOS transistors 226 and 228, each having a control electrode coupled to receive AZ. Current source 232 is coupled between Vdd and a circuit node 250, which corresponds to an output of cascode amplifier 262. A first current terminal (e.g. drain) of N3 is coupled to node 250, a control electrode of N3 is coupled to a first terminal of a capacitor 230 at a circuit node 246, and a second current electrode of N3 is coupled to a circuit node 248. A capacitor 230 has a first terminal coupled to node 246 and a second terminal coupled to Vss. A first current electrode (e.g. drain) of N2 is coupled to the second current electrode of N3 at node 248, a second current electrode (e.g. source) of N2 is coupled to Vss. A first terminal of capacitor 220 is coupled to node 242 (corresponding to an output of differential amplifier 260), and a second terminal of capacitor 220 is coupled to a control electrode of N2.

Control switches (e.g. transistors 226 and 228) of cascode amplifier 262 are coupled between the gate and drains of N3 and N2 to selectively short the gate to drains based on the value of AZ. Transistor 226 has a first current electrode coupled to the control electrode of N3 at circuit node 246, a second current electrode coupled to the first current electrode (e.g. drain) of N3 at node 250, and a control electrode coupled to receive AZ. Transistor 228 has a first current electrode coupled to the control electrode of N2 at circuit node 252, a second current electrode coupled to the first current electrode of N2 at node 248, and a control electrode coupled to receive AZ. Therefore, when AZ is asserted to a logic level one, the gates of N3 and N2 are each shorted to their corresponding drains. When AZ is negated to a logic level 0, transistors 226 and 230 are off, in which the gates of N3 and N2 are no longer shorted to their corresponding drains.

An inverter 234 has an input coupled to node 250, corresponding to the output of cascode amplifier 262. Inverter 234 has an output coupled to provide Vo. Note that, although illustrated as a single inverter, inverter 234 can be implemented with a series of inverters (such as a series of an odd number of inverters) to apply more gain and further digitize (e.g. sharpen) the signal at Vo. Note that inverter 234 can also be referred to as a logic stage.

In operation, control circuitry 126 controls AZ so as to operate comparator 200 of FIG. 2 in two stages: an auto-zero phase (in which AZ is asserted to a logic level one) and a compare phase (in which AZ is negated to a logic level zero). In one embodiment, as will be described in reference to FIGS. 3-5 below, comparator 200 can be used in ZC comparator 114 in which Vo (corresponding to ZC) is asserted when $I_L$ has fallen to zero. In another embodiment, as will be described in reference to FIG. 6 below, comparator 200 can be used in OC comparator 116 in which Vo (corresponding to OC) is asserted when $I_L$ has reached a maximum current, $I_{max}$ (which can be provided by a replica circuit 118, also illustrated in FIG. 6).

Figure 3:
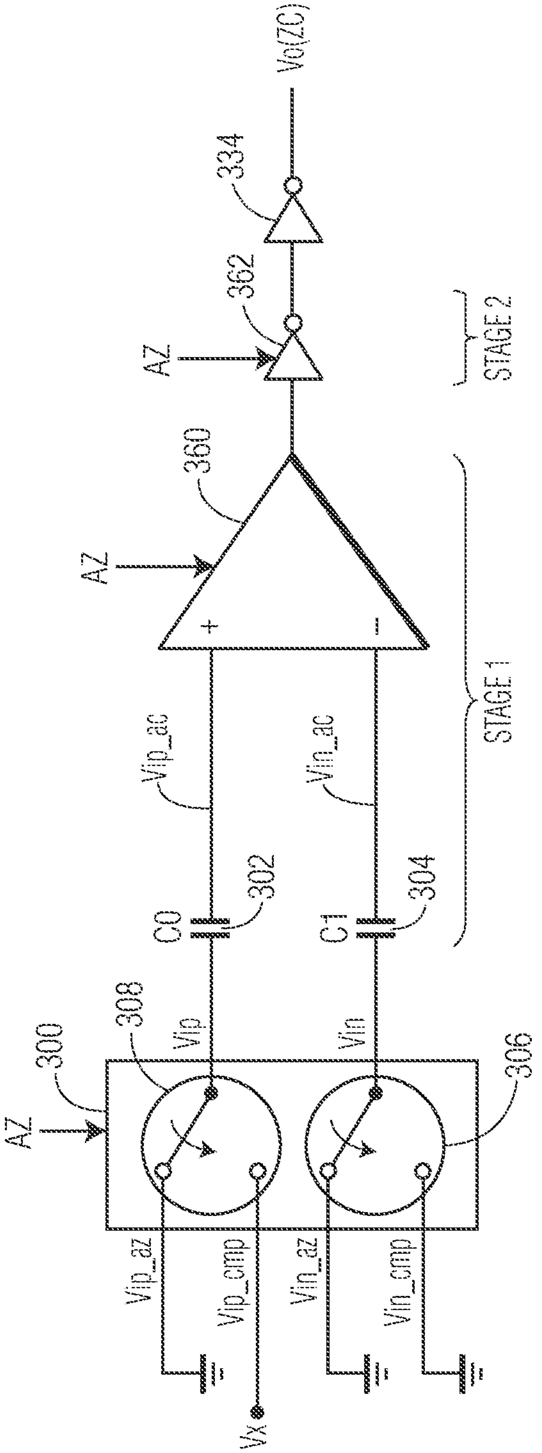
FIG. 3 illustrates a current comparator having a front-end input signal switch usable within the ZC comparator of FIG. 1 which is implemented as illustrated in FIG. 2, in accordance with one embodiment of the present invention.

FIG. 3 illustrates, in partial schematic and partial block diagram form, a more detailed view of ZC comparator 114 which includes a front-end input signal switch 300 and a comparator, such as comparator 200 of FIG. 2, which includes input capacitors C0 302 and C1 304 (which are analogous to C0 and C1, respectively, of comparator 200), a Stage 1 with a differential amplifier 360 (which may be implemented with differential amplifier 260 of FIG. 2), a Stage 2 with a cascode amplifier 362 (which may be implemented with differential amplifier 262 of FIG. 2), and an inverter 334 (which is analogous to inverter 234 of FIG. 2). Therefore, the descriptions provided for comparator 200 of FIG. 2 apply to the comparator of FIG. 3. Input signal switch 300 is coupled to provide the appropriate inputs to Vip and Vin, respectively, for the auto-zero phase and compare phase. When AZ is asserted to a logic level one, indicating the auto-zero phase, switches 308 and 306 of input switch 300 are set to their first position to provide Vip_az to Vip and Vin_az to Vin, and when AZ is asserted to a logic level zero, indicating the compare phase, switches 308 and 306 of input switch 300 are set to their second position to provide Vip_cmp to Vip and Vin_cmp to Vin. For ZC comparator 114, each of Vip_az, Vin_az, and Vin_cmp are coupled to Vss, and Vip_cmp is coupled to Vx (at node 124 of converter 100 of FIG. 1).

In operation, during the AZ phase of ZC comparator 114, switches 308 and 306 are set in their first position in which both Vin and Vip are coupled to Vss (which may be provided by a local AC ground). Note that Vo of FIG. 3, when operated with the two phases, can be expressed as "Vo=A [(Vip_cmp−Vin_cmp)−(Vip_az−Vin_az)]" in which A refers to a gain of the comparator and is generally large enough that Vo will saturate at either its positive or negative supply. In the case of ZC comparator 114, during the auto-zero phase, Vip_az=Vin_az, which causes these terms to drop out of the equation, in addition to any offsets naturally present in the circuit. Operation of ZC comparator 114 will be described in reference to the elements of comparator 200 of FIG. 2.

Figure 4:
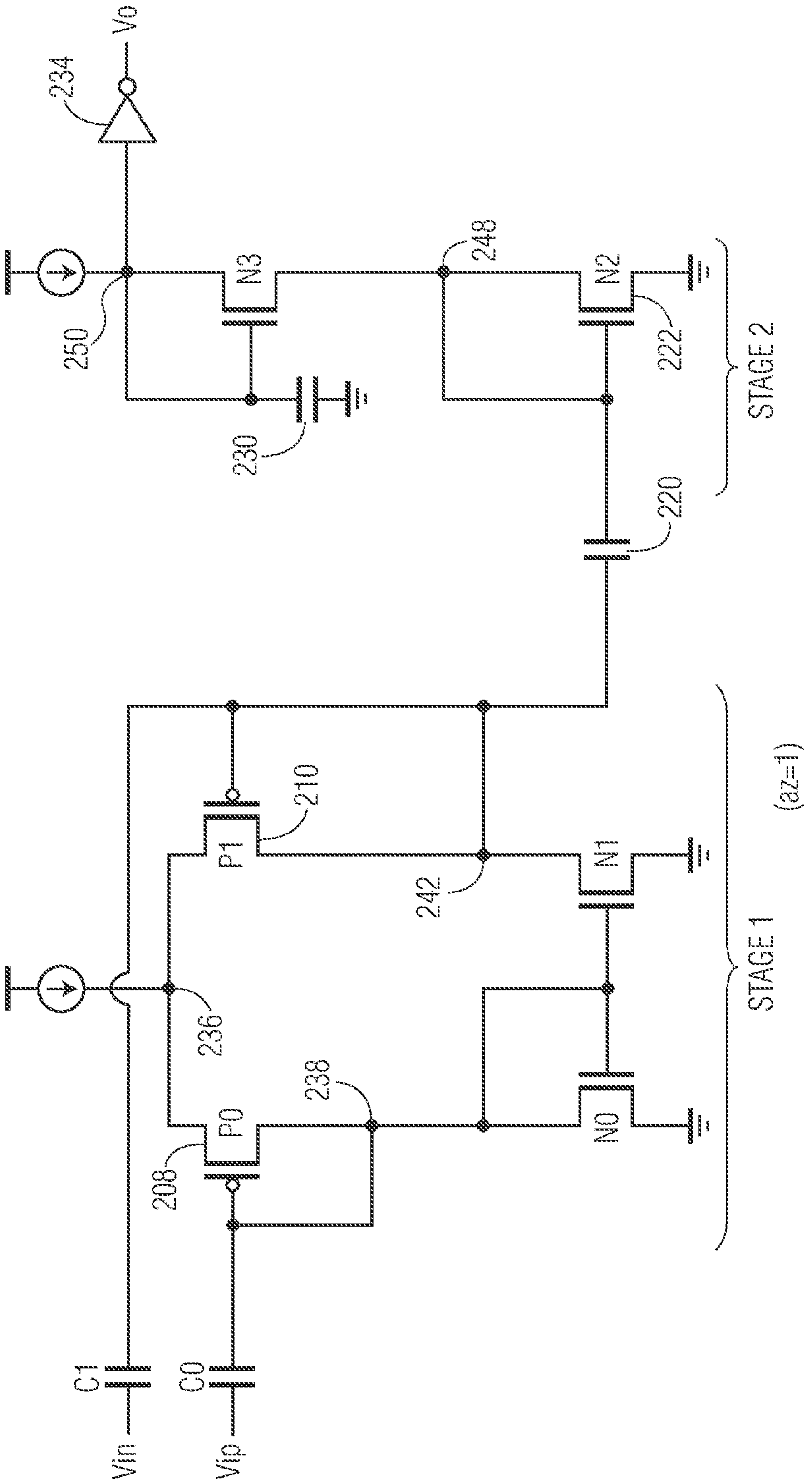
FIGS. 4 and 5 illustrate the current comparator of FIGS. 2 and 3 during different phases of operation, corresponding to values of the AZ control signal, in accordance with one embodiment of the present invention.

During the auto-zero phase (with AZ=1), switches 216, 218, 226, and 230 (also referred to as auto-zero switches) are all turned on, shorting the corresponding gates and drains. The resulting circuit, using the elements of comparator 200 of FIG. 2, is illustrated in FIG. 4. As illustrated in FIG. 4, the gate of P0 is shorted to node 238 and the gate of P1 is shorted to node 242. With Vin and Vip each coupled to ground, the voltage over C0 (V(C0)) can be expressed as $V(C0)=V_{TN0}$, in which $V_{TN0}$ is the threshold voltage (Vt) of N0 (i.e. the voltage at node 238). Similarly, the voltage over C1 (V(C1) can be expressed as $V(C1)=V_{TN0}+V_{TP0}-V_{TP1}$, in which $V_{TP0}$ and $V_{TP1}$ correspond to the Vt of each of P0 and P1, respectively. The offset between C0 and C1 can be expressed as $V(C0)-V(C1)=V_{TP1}-V_{TP0}$ (since the $V_{TN0}$'s cancel each other) and the amplifier's natural offset is $V_{TP0}-V_{TP1}$. In cascode amplifier 262, as illustrated in FIG. 4, the gate of N3 is shorted node 250, and the gate of N2 is shorted to node 248.

The offset between C0 and C1 is stored on capacitors C0 and C1 at the input of Stage 1, and capacitor 220 serves as a DC block to keep stage 2 biased in a high-gain state. Capacitor 230 also serves a similar purpose in maintaining the biasing condition established during the auto-zero phase. Note that during the auto-zero phase, the voltage at node 250 can be expressed as "$V_{TN2}+V_{TN3}$" (in which $V_{TN2}$ and $V_{TN3}$ correspond to the Vt's of N2 and N3, respectively). This voltage at node 250 (which is about two Vt's) is near the switching threshold of inverter 234. That is, the capacitors of comparator 200 operate to store a voltage at the input of inverter 234 which is close to its switching threshold. This allows for improved precision when receiving smaller input voltages, or input voltages having a smaller voltage difference between them, by cancelling any offsets in the amplifier.

Figure 5:
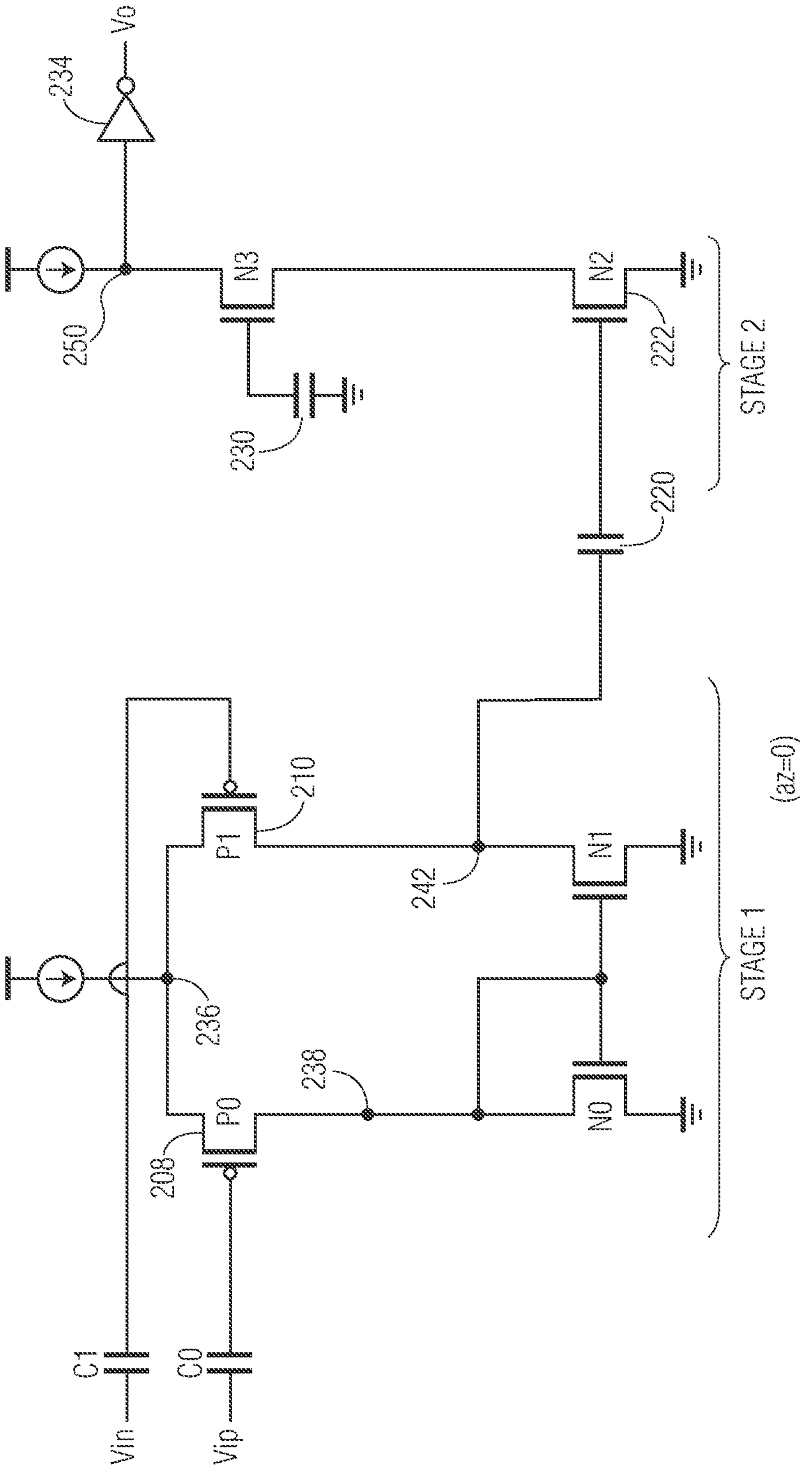

During the compare phase (with AZ=0), switches 216, 218, 226, and 230 are turned off, thus placed into a high-Z state. The resulting circuit, using the elements of comparator 200 of FIG. 2, is illustrated in FIG. 5. During the compare phase, Stage 1 behaves as a differential amplifier and Stage 2 as a single-ended cascode amplifier. Referring to FIG. 2 (in which switches 308 and 306 are set to their second position for the compare phase), the "+" input to differential amplifier 360 is labeled as Vip_ac in which Vip_ac=Vx+V(C0), and the "−" input is labeled as Vin_ac in which Vin_ac=0+V(C1). In this case, Vip_ac−Vin_ac=Vx+V(C0)−V(C1). Therefore, it can be seen that the offset in the compare phase (V(C0)−V(C1)) is canceled by the offset stored in the auto-zero phase. Also, with the input to inverter 234 being set close to its switching threshold in the auto-zero phase, the zero crossing (ZC) by Vx can be quickly and accurately detected (resulting in asserting ZC to a logic level one).

Figure 6:
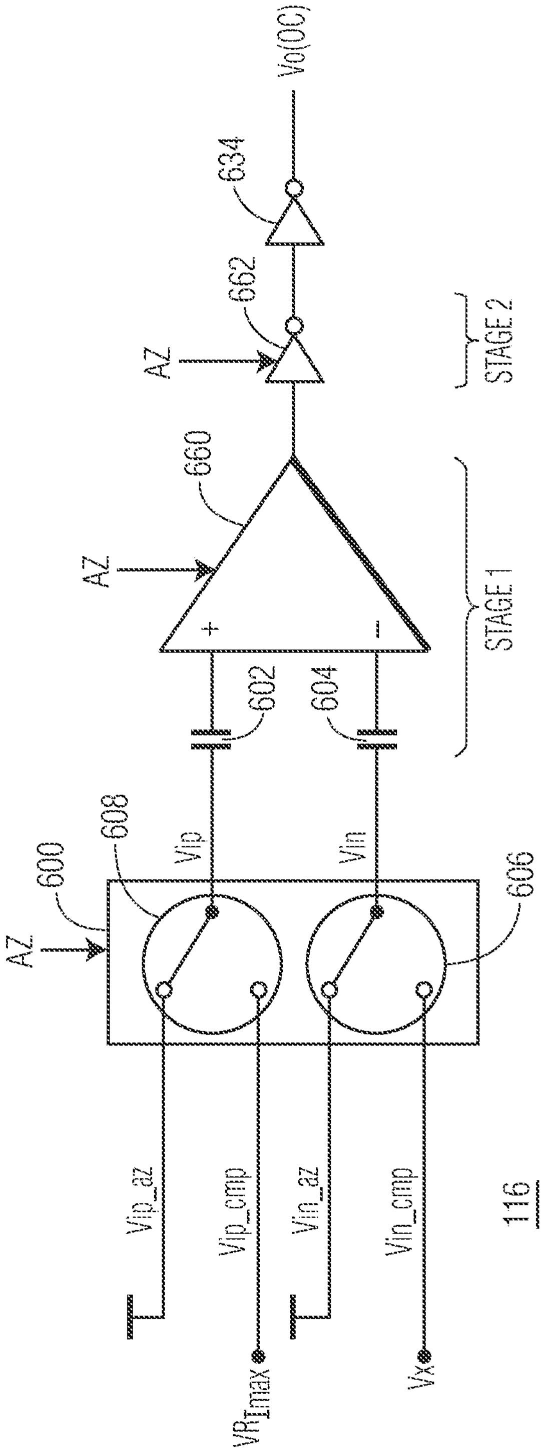
FIG. 6 illustrates a current comparator having a front-end input signal switch usable within the OC comparator of FIG. 1 which is implemented as illustrated in FIG. 2, in accordance with one embodiment of the present invention.

As indicated above, a comparator such as comparator 200 can also be used in OC comparator 116. Therefore, FIG. 6 illustrates, in partial schematic and partial block diagram form, a more detailed view of OC comparator 116 which includes a front-end input signal switch 600 (analogous to input signal switch 300) and a comparator, such as comparator 200 of FIG. 2, which includes input capacitors C0 602 and C1 604 (which are analogous to C0 and C1, respectively, of comparator 200), a Stage 1 with a differential amplifier 660 (which may be implemented with differential amplifier 260 of FIG. 2), a Stage 2 with a cascode amplifier 662 (which may be implemented with differential amplifier 262 of FIG. 2), and an inverter 634 (which is analogous to inverter 234 of FIG. 2). Therefore, the descriptions provided for comparator 200 of FIG. 2 also apply to the comparator of FIG. 6. Input signal switch 600 is coupled to provide the appropriate inputs to Vip and Vin, respectively, for the auto-zero phase and compare phase. When AZ is asserted to a logic level one, indicating the auto-zero phase, switches 608 and 606 of input switch 600 are set to their first position to provide Vip_az to Vip and Vin_az to Vin, and when AZ is asserted to a logic level zero, indicating the compare phase, switches 608 and 606 of input switch 600 are set to their second position to provide Vip_cmp to Vip and Vin_cmp to Vin. For OC comparator 116, each of Vip_az and Vin_az are coupled to Vdd, Vin_cmp is coupled to receive $VR_{Imax}$ (which corresponds to a voltage input from a reference circuit which generates the maximum current, $I_{max}$, for the current rating of inductor 110), and Vin_cmp is coupled to Vx (node 124 of converter 100 of FIG. 1).

Referring back to FIG. 1, note that replica circuit 118 (intended to replicate transistor 102 and Vx) includes a PMOS transistor 120 having a first current electrode coupled to Vdd, a control electrode coupled to Vss, and a second current electrode coupled to a first terminal of a current source 122. A second terminal of current source 122 is coupled to Vss. Current source 122 may be set, for example, to $I_{max}$/M in which M represents the sizing of transistor 102 with respect to transistor 120. The second current electrode of transistor 120 provides the voltage $VR_{Imax}$ to OC comparator 116. In the illustrated embodiment, note that, because transistor 120 is a scaled replica of transistor 102, when $I_L$ through inductor 110 reaches $I_{max}$, the voltage at $VR_{Imax}$ will equal Vx, therefore, this comparison can be used to detect an OC condition (similar to how the comparison between zero and Vx is used to detect a ZC condition). Note that alternate embodiments may use other types of circuitry, such as other replica circuits, to provide an indication of $I_{max}$ to OC comparator 116.

Therefore, during the auto-zero phase of OC comparator 116, rather than setting both Vin and Vip to Vss, both are set to Vdd. However, since Vip_az=Vin_az in this case as well, these terms also drop out of the equation. With AZ=1 during the auto-zero phase (in which switches 606 and 608 are in their first position), comparator 200 is configured as was described above with respect to FIG. 4 (in which the auto-zero switches are all turned on), which results in again storing the offset V(C0)−V(C1) at the input capacitors C1 and C0. With AZ=0 during the compare phase (in which switches 606 and 608 are in their second position), comparator 200 is configured as was described above with respect to FIG. 5 (in which the auto-zero switches are off). In this case, though, rather than compare Vx (Vip=Vx) to 0 (Vin=0) to determine a ZC condition, $VR_{Imax}$ (Vip=$VR_{Imax}$) is compared to Vx (Vin=Vx) to determine an OC condition.

Note that the descriptions provided above with respect to FIGS. 4 and 5 for the operation of comparator 200 when used in ZC comparator 114 are similar to the operation of comparator 200 when used in OC comparator 116. Converter 100 may include either ZC comparator 114 or OC comparator 116 or may include both (as in the illustrated embodiment of FIG. 1). In an embodiment in which converter 100 includes both the ZC and OC comparators, two different instantiations of current comparator 200 are required, one for the ZC comparator and one for the OC comparator. Each of the outputs ZC and OC are provided to control circuitry 126 so that control circuitry 126 can disable transistor 104 in response to a ZC condition occurring (i.e. in response to assertion of ZC) and can disable transistor 102 in response to an OC condition occurring (i.e. in response to assertion of OC). Note that comparator 200 can be used in other embodiments as well, such as in different types of DC-DC converters.

With the use of comparator 200 of FIG. 2, note that the Miller effect may be mitigated or defeated. As known in the art, the Miller effect accounts for an increase in the equivalent input capacitance of an inverting voltage amplifier due to amplification of the effect of capacitance between the input and output terminals. For example, for an inverting amplifier Vout=−Av*Vin in which −Av is the voltage gain of the inverting amplifier and a feedback capacitance (C) is present between Vin and Vout. However, the increased input capacitance due to the Miller effect can be expressed as $C_M$=C(1+Av). With the use of comparator 200, however, the large virtual capacitance which would appear at the input to differential amplifier 260 due to the Miller effect can be mitigated or overcome. For example, since the inputs of the first stage (Vin and Vip) are coupled to low impedance power switches (e.g. transistors 102 and 104), a faster RC time constant is achievable thus reducing the impact of $C_M$. Also, by having a lower voltage gain, the effect from $C_M$ is smaller. In comparator 200, cascode amplifier 262 of Stage 2 helps achieve a lower voltage gain from node 252 to node 248 for the comparator, thereby mitigating the Miller effect.

For example, referring to comparator 200 of FIG. 1, assuming that the offset is fully cancelled at input capacitors 202 and 204, if (Vin>Vip) is initially applied, the output of Stage 1 (at node 242) will initially be low, the out put of Stage 2 will initially be high, and Vo will initially be low. In this configuration, the transistors of Stage 2 are kept in saturation, and thus amplifier 262 behaves as a cascoded amplifier (reducing the Miller effect) and current for the falling edge is set by the common-source transistor's transconductance. On the other hand, if (Vip>Vin) is initially applied, the output of Stage 2 (at node 250) is low, the pull-up current is limited by the bias current and amplifier transistors are in triode mode, which increases their channel capacitance, so the circuit will respond significantly more slowly.

Unlike other auto-zeroed comparators in analog-to-digital converters (ADCs), auto-zeroed comparators in DC-DC converters for current sensing thresholds will naturally have their inputs slew in one specification direction each cycle. For example, in a high-side PMOS power switch in a buck converter (e.g. transistor 102), the inductor current $I_L$ will increase when the high-side is enabled, and the drain voltage (e.g. Vx) will become progressively lower than the supply. Similarly, with a low-side NMOS power switch in a buck converter (e.g. transistor 104), the drain voltage (e.g. Vx) will consistently become more positive. Because the slew direction of the input voltage is pre-determined, the converter circuit can be optimized for response time to a given input slew.

Also, note that comparator 200 performs an earlier conversion from differential to single-ended signals (through differential amplifier 260, prior to Stage 2). This permits reducing the bias current of some stages (e.g. in half) when compared to other comparator designs in which more stages are each kept fully differential. Note also that at least having Stage 1 receive differential inputs allows for lower voltage converters as opposed to using a single ended Stage 1 due to problems for a single ended first stage caused by variations in the ground potential.

Figure 7:
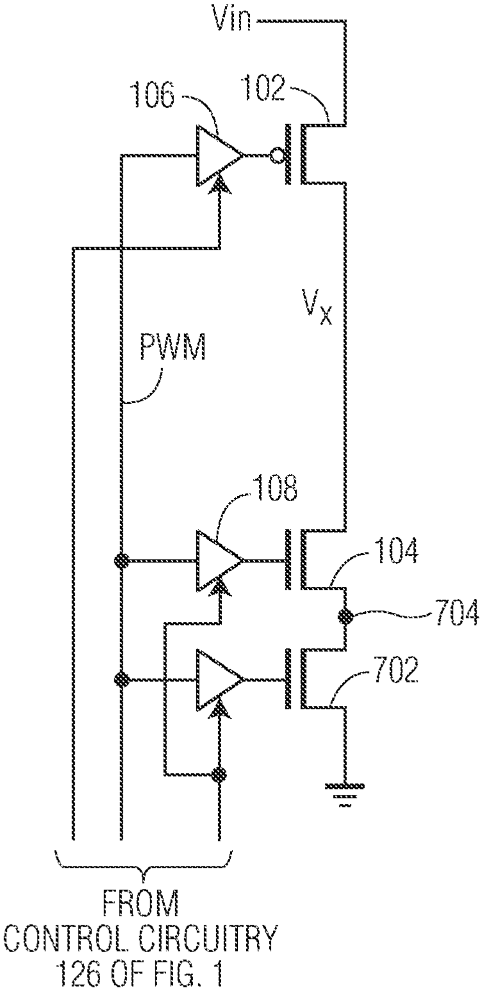
FIG. 7 illustrates, in schematic form, a power stage of the DC-DC buck converter of FIG. 1 in accordance with one embodiment of the present invention.

In alternate embodiments, comparator 200 may instead use an NMOS differential pair as opposed to P0 and P1. Also, additional gain stages may be used in addition to those illustrated (e.g. in addition to cascode amplifier 262). However, if so, they should alternate between NMOS and PMOS cascode amplifiers to achieve the intended high-speed operation. Also, in alternate embodiments, the auto-zeroing switches (e.g. switches 216, 218, 226, and 230) can instead be implemented as PMOS switches or may be implemented using a different combination of circuitry. Alternate embodiments may also use different power switch topologies than single transistor switches illustrated for switches 104 and 102, and the corresponding simple replica switch 120. For example, FIG. 7 illustrates in an embodiment of the power stage of converter 100 which implements the low-side switch as two NMOS transistors in series (e.g. transistor 104 in series with an NMOS transistor 702) between PMOS transistor 102 and the second voltage supply terminal. In this example, front-end input signal switches 300 and 600 may instead be coupled to a second internal node 704 of the power stage located between these two series-connected NMOS transistors 104 and 702 for use during the compare phases of ZC 114 or OC 116, rather than using the first internal node, Vx, directly. Also note that different switch topologies may be used to implement the functionality of the front-end input signal switches (e.g. switches 300 and 600). For example, multiple switches or devices may be used to implement each of the input switches (e.g. 308, 306, 608, 606). Also, while inverter 234 forms an output inverter for comparator 200, as described above, inverter 234 (also referred to as logic stage 234) can be implemented in a variety of different ways, such as including more than one inverter or can use a more complicated logic circuit (such as with NAND or NOR gates, or other combinations of gates, to block leakage current during the auto-zeroing phase or to give a defined state when disabled.

Note that DC-DC comparator 100 may be implemented using split grounds in which different voltage supply terminals (e.g. ground terminals) may be used for different portions of DC-DC comparator 100 to provide ground voltages (in which, in one embodiment, the ground terminals can be connected or shorted to each other at the printed circuit board (PCB)). In one embodiment, the second voltage supply terminal (e.g. ground terminal) which is configured to provide Vss (e.g. a ground signal) for the power stage may be a different ground terminal as used for ZC comparator 114 or OC comparator 116. For example, the ground terminal for the comparators may be a third voltage supply terminal configured to provide a second ground signal, but this second ground signal may be different from the ground signal provided by the second voltage supply terminal to the power stage. That is, the supplied Vss voltages may be different between the power stage and comparators (but are all still less than Vdd). Furthermore, based on the embodiment, different ground signals may be used for the AZ phase vs the compare phase for each comparator. For example, in ZC comparator 114, front-end switch 300 may connect the third voltage supply terminal to the Vip and Vin inputs of stage 1, but connect the second voltage supply terminal to the Vin input for the compare phase. Similarly, note that different voltage supply terminals may be used for different portions of DC-DC comparator 100 to provide supply voltages. For example, a fourth voltage supply terminal may be used to provide Vdd to ZC comparator 114 or OC comparator 116, in which this Vdd may be lower than the Vdd provided by the first voltage supply terminal to the power stage. For example, the Vdd for the power stage may be 3.3V while the Vdd for the comparators may be 1.8V. This may help protect lower voltage devices within the comparators. Note also that for OC comparator 116, since it is preferable that the Vdds used as inputs during the AZ phase are similar to the Vdd used during the compare phase, even if the Vdd for the comparators is lower as compared to the power stage (e.g. 1.8V instead of 3.3V), the Vdds used as inputs during the AZ phase as well as the Vdd used during the comparison phase may all be the Vdd which is applied to the power stage (e.g. the higher 3.3V).

Therefore, by now it can be appreciated that a current comparator configuration has been provided which can be used in various threshold current comparators, such as in an ZC comparator or an OC comparator. In one embodiment, the current comparator includes a first stage with a differential amplifier and a second stage with a cascode amplifier, and the current comparator operates in an auto-zero phase followed by a compare phased. In the auto-zero phase, auto-zeroing switches are used to tie gates and drains of various transistors in each of the first and second stages in order to store an offset into input capacitors during an auto-zeroing phase. During the compare phase, the auto-zeroing switches are turned off so as to allow the differential amplifier and cascode amplifiers to operate normally. The initial stored offset cancels the offset during the compare phase in which a first input voltage is compared with a second input voltage. An output of the comparator indicates when the first input voltage has reached the second input voltage. Such a current comparator may be used as the ZC comparator or OC comparator of, for example, a DC-DC buck converter. For example, for the ZC comparator within a buck converter, the output of the current comparator indicates when Vx at the first input voltage (representative of the current through the inductor of the buck converter) has reached 0 at the second input voltage. For an OC comparator within the buck converter, the output of the current comparator indicates when a $V_{RImax}$ at the first input voltage (the voltage representative of a maximum current allowed through the inductor) has reached Vx at the second input voltage.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterisk (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Some of the above embodiments, as applicable, may be implemented using a variety of different applications. For example, although FIG. 1 and the discussion thereof describe an exemplary configuration of a DC-DC converter, this exemplary configuration is presented merely to provide a useful reference in discussing various aspects of the invention. Therefore, the description of the architecture has been simplified for purposes of discussion, and it is just one of many different types of converters and configurations that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the configurations depicted herein are merely exemplary, and that in fact many other configurations can be implemented which achieve the same functionality.

Also for example, in one embodiment, the illustrated elements of converter 10 are circuitry located on a single integrated circuit or within a same device, in which, for example, converter 10 can be implemented in a system on a chip (SoC). Alternatively, converter 10 may be used in a system which includes any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the current comparator can be used in other applications, such as in other types of threshold comparators or in other types of DC-DC converters. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention. Note that any of the aspects below can be used in any combination with each other and with any of the disclosed embodiments.

In one embodiment, a current comparator includes a first capacitor having a first terminal coupled to a first input signal; a second capacitor having a first terminal coupled to a second input signal; a first transistor having a first current electrode coupled to a first voltage supply terminal via a first current source, a control electrode coupled to a second terminal of the first capacitor, and a second current electrode coupled to a first circuit node; a second transistor having a first current electrode coupled to the first current electrode of the first transistor, a control electrode coupled to a second terminal of the second capacitor, and a second current electrode coupled to a second circuit node; a third transistor having a first current electrode coupled to the first circuit node, a second current electrode coupled to a second voltage supply terminal, and a control electrode coupled to the first circuit node; a fourth transistor having a first current electrode coupled to the second circuit node, a control electrode coupled to the control electrode of the third transistor, and a second current electrode coupled to the second voltage supply terminal; a single-ended cascode amplifier having an input coupled via a third capacitor to the second circuit node and an output; a logic stage coupled to receive the output of the single-ended cascode amplifier, and configured to provide an output of the current comparator; and a set of auto-zero switches configured to, in response to an auto-zero control signal, selectively short the control electrode of the first transistor to the second current electrode of the first transistor and selectively short the control electrode of the second transistor to the second current electrode of the second transistor. In one aspect, the single-ended cascode amplifier includes a fifth transistor having a control electrode configured as the input of the single-ended cascode amplifier, a first current electrode coupled to the second voltage supply terminal, and a second current electrode; and a sixth transistor having a first current electrode coupled to the second current electrode of the fifth transistor, a control electrode, and a second current electrode coupled to the output of the single-ended cascode amplifier, wherein the set of auto-zero switches is further configured to, in response to the auto-zero control signal, selectively short the control electrode of the fifth transistor to the second current electrode of the fifth transistor and selectively short the control electrode of the sixth transistor to the second current electrode of the sixth transistor. In a further aspect, the control electrode of the sixth transistor is coupled to the second voltage supply terminal via a fourth capacitor. In another further aspect, the current comparator is configured to operate in an auto-zero phase followed by a compare phase, wherein, during the auto-phase, the set of auto-zero switches are configured to short the control electrode to the second current electrode of each of the first, second, fifth, and sixth transistors, and during the compare-phase, the set of auto-zero switches is each in a high-impedance state. In yet a further aspect, each of the first and second transistors are PMOS transistors and each of the third, fourth, fifth, and sixth transistors are NMOS transistors. In yet an even further aspect, each of the set of auto-zero switches is implemented as an NMOS transistor. In another aspect of the embodiment, the current comparator is configured to operate in an auto-zero phase followed by a compare phase, wherein, during the auto-phase, the set of auto-zero switches are configured to short the control electrode to the second current electrode of each of the first and second transistors, and during the compare-phase, the set of auto-zero switches is each in a high-impedance state.

In another aspect of the embodiment, a DC-DC converter includes the current comparator of the embodiment, and an input signal switch configured to provide auto-zero phase inputs as the first and second input signals of the current comparator during the auto-zero phase and to provide compare phase inputs as the first and second input signals of the current capacitor during the compare phase. In a further aspect of the DC-DC converter, the auto-zero phase inputs provided as the first and second input signals during the auto-zero phase are a same signal, and the compare phase inputs provided as the first and second input signals during the compare phase are a pair of signals being compared such that the output of the current comparator is provided based on the comparison of the pair of signals. In another aspect of the DC-DC converter, the DC-DC converter further includes a power switch having a PMOS transistor in series with an NMOS transistor, wherein a first internal circuit node between the PMOS transistor and the NMOS transistor is configured to be coupled to an inductor. In a further aspect of the DC-DC converter, during the auto-zero phase, the input signal switch couples a first ground signal to each of the first and second input signals of the current comparator, and, during the compare phase, the input signal switch couples a second internal circuit node of the power switch and a second ground signal to the first and second input signals of the current comparator, wherein the output of the current comparator indicates when a voltage on the second internal circuit node reaches a voltage of the second ground signal. In yet a further aspect of the DC-DC converter, the DC-DC converter further includes control circuitry, wherein when the output of the current comparator is asserted to indicate that the voltage on the second internal circuit node has reached the voltage of the second ground signal, the control circuitry disables the NMOS transistor of the power switch. In yet a further aspect, the power switch further comprises an additional NMOS transistor coupled between the NMOS transistor of the power switch and a third voltage supply terminal configured to provide the second ground signal, the second internal circuit node of the power switch corresponds to a node between the NMOS transistor and additional NMOS transistor of the power switch, and the first ground signal is provided by one of the second voltage supply terminal or the third voltage supply terminal. In another aspect of the DC-DC converter, during the auto-zero phase, the input signal switch couples a supply voltage to each of the first and second input signals of the current comparator, and, during the compare phase, the input signal switch couples a voltage indicative of a predetermined maximum current through the inductor and the internal circuit node of the power switch to the first and second input signals of the current comparator, wherein the output of the current comparator indicates when a voltage on the internal circuit node reaches the voltage indicative of the predetermined maximum current. In a further aspect, the DC-DC further includes a replica circuit configured to provide the voltage indicative of the predetermined maximum current to the input signal switch.

In another embodiment, a current comparator includes a first capacitor having a first terminal coupled to a first input signal; a second capacitor having a first terminal coupled to a second input signal; a first transistor having a first current electrode coupled to a first voltage supply terminal via a first current source, a control electrode coupled to a second terminal of the first capacitor, and a second current electrode coupled to a first circuit node; a second transistor having a first current electrode coupled to the first current electrode of the first transistor, a control electrode coupled to a second terminal of the second capacitor, and a second current electrode coupled to a second circuit node; a third transistor having a first current electrode coupled to the first circuit node, a second current electrode coupled to a second voltage supply terminal, and a control electrode coupled to the first circuit node; a fourth transistor having a first current electrode coupled to the second circuit node, a control electrode coupled to the control electrode of the third transistor, and a second current electrode coupled to the second voltage supply terminal; and a single-ended cascode amplifier having an input coupled via a third capacitor to the second circuit node and an output, wherein the current comparator is configured to operate in an auto-zero phase followed by a compare phase, wherein, during the auto-phase, the current comparator is configured to short the control electrode to the second current electrode of each of the first and second transistors, and during the compare phase, the current comparator is configured to not short the control electrode to the second current electrode of each of the first and second transistors. In one aspect of the another embodiment, the current comparator further includes a logic stage coupled to receive the output of the single-ended cascode amplifier, and configured to provide an output of the current comparator. In another aspect, the single-ended cascode amplifier includes a fifth transistor having a control electrode configured as the input of the single-ended cascode amplifier, a first current electrode coupled to the second voltage supply terminal, and a second current electrode; and a sixth transistor having a first current electrode coupled to the second current electrode of the fifth transistor, a control electrode, and a second current electrode coupled to the output of the single-ended cascode amplifier, wherein the current comparator is further configured to, during the auto-zero phase, short the control electrode of the fifth transistor to the second current electrode of the fifth transistor and short the control electrode of the sixth transistor to the second current electrode of the sixth transistor, and, during the compare phase, not short the control electrode to the second current electrode of each of the fifth and sixth transistors.

In another aspect, a DC-DC converter includes the current comparator of the another embodiment, and a power switch having a PMOS transistor in series with an NMOS transistor, wherein an internal circuit node between the PMOS transistor and the NMOS transistor is configured to be coupled to an inductor, and wherein, during the auto-zero phase, a first ground signal is provided as each of the first and second input signals of the current comparator, and, during the compare phase, a second internal circuit node of the power switch and a second ground signal are provided to the first and second input signals of the current comparator, wherein the output of the current comparator indicates when a voltage on the second internal circuit node reaches a voltage of the second ground signal.

In another aspect, a DC-DC converter includes the current comparator of the another embodiment, and a power switch having a PMOS transistor in series with an NMOS transistor, wherein an internal circuit node between the PMOS transistor and the NMOS transistor is configured to be coupled to an inductor, and wherein, during the auto-zero phase, a supply voltage is provided as each of the first and second input signals of the current comparator, and, during the compare phase, a voltage indicative of a predetermined maximum current through the inductor and the internal circuit node are coupled to the first and second input signals of the current comparator, wherein the output of the current comparator indicates when a voltage on the internal circuit node reaches the voltage indicative of the predetermined maximum current.

What is claimed is:

1. A current comparator, comprising: a first capacitor having a first terminal coupled to a first input signal;

a second capacitor having a first terminal coupled to a second input signal;

a first transistor having a first current electrode coupled to a first voltage supply terminal via a first current source, a control electrode coupled to a second terminal of the first capacitor, and a second current electrode coupled to a first circuit node;

a second transistor having a first current electrode coupled to the first current electrode of the first transistor, a control electrode coupled to a second terminal of the second capacitor, and a second current electrode coupled to a second circuit node;

a third transistor having a first current electrode coupled to the first circuit node, a second current electrode coupled to a second voltage supply terminal, and a control electrode coupled to the first circuit node;

a fourth transistor having a first current electrode coupled to the second circuit node, a control electrode coupled to the control electrode of the third transistor, and a second current electrode coupled to the second voltage supply terminal;

a single-ended cascode amplifier having an input and an output, wherein the second circuit node is coupled to a first terminal of a third capacitor, and a second terminal of the third capacitor, different from the first terminal, is coupled to the input of the single-ended cascode amplifier;

a logic stage coupled to receive the output of the single-ended cascode amplifier, and configured to provide an output of the current comparator; and a set of auto-zero switches configured to, in response to an auto-zero control signal, selectively short the control electrode of the first transistor to the second current electrode of the first transistor and selectively short the control electrode of the second transistor to the second current electrode of the second transistor;

wherein the single-ended cascode amplifier comprises:

a fifth transistor having a control electrode configured as the input of the single-ended cascode amplifier, a first current electrode coupled to the second voltage supply terminal, and a second current electrode, wherein the second terminal of the third capacitor is coupled to the control electrode of the fifth transistor; and a sixth transistor having a first current electrode coupled to the second current electrode of the fifth transistor, a control electrode, and a second current electrode coupled to the output of the single-ended cascode amplifier, wherein the set of auto-zero switches is further configured to, in response to the auto-zero control signal, selectively short the control electrode of the fifth transistor to the second current electrode of the fifth transistor and selectively short the control electrode of the sixth transistor to the second current electrode of the sixth transistor.

2. The current comparator of claim 1, wherein the control electrode of the sixth transistor is coupled to the second voltage supply terminal via a fourth capacitor.

3. The current comparator of claim 1, wherein the current comparator is configured to operate in an auto-zero phase followed by a compare phase, wherein during the auto-zero phase, the set of auto-zero switches are configured to short the control electrode to the second current electrode of each of the first, second, fifth, and sixth transistors, and during the compare-phase, the set of auto-zero switches is each in a high-impedance state.

4. The current comparator of claim 3, wherein each of the first and second transistors are PMOS transistors and each of the third, fourth, fifth, and sixth transistors are NMOS transistors.

5. The current comparator of claim 4, wherein each of the set of auto-zero switches is implemented as an NMOS transistor.

6. The current comparator of claim 1, wherein the current comparator is configured to operate in an auto-zero phase followed by a compare phase, wherein, during the auto-zero phase, the set of auto-zero switches are configured to short the control electrode to the second current electrode of each of the first and second transistors, and during the compare-phase, the set of auto-zero switches is each in a high-impedance state.

7. A DC-DC converter comprising:

the current comparator of claim 1;

an input signal switch configured to provide auto-zero phase inputs as the first and second input signals of the current comparator during the auto-zero phase and to provide compare phase inputs as the first and second input signals of the current capacitor during the compare phase.

8. The DC-DC converter of claim 7, wherein the auto-zero phase inputs provided as the first and second input signals during the auto-zero phase are a same signal, and the compare phase inputs provided as the first and second input signals during the compare phase are a pair of signals being compared such that the output of the current comparator is provided based on the comparison of the pair of signals.

9. The DC-DC converter of claim 7, further comprising:

a power switch having a PMOS transistor in series with an NMOS transistor, wherein a first internal circuit node between the PMOS transistor and the NMOS transistor is configured to be coupled to an inductor.

10. The DC-DC converter of claim 9, wherein:

during the auto-zero phase, the input signal switch couples a first ground signal to each of the first and second input signals of the current comparator, and during the compare phase, the input signal switch couples a second internal circuit node of the power switch and a second ground signal to the first and second input signals of the current comparator, wherein the output of the current comparator indicates when a voltage on the second internal circuit node reaches a voltage of the second ground signal.

11. The DC-DC converter of claim 10, further comprising:

control circuitry, wherein when the output of the current comparator is asserted to indicate that the voltage on the second internal circuit node has reached the voltage of the second ground signal, the control circuitry disables the NMOS transistor of the power switch.

12. The DC-DC converter of claim 11, wherein:

the power switch further comprises an additional NMOS transistor coupled between the NMOS transistor of the power switch and a third voltage supply terminal configured to provide the second ground signal, the second internal circuit node of the power switch corresponds to a node between the NMOS transistor and the additional NMOS transistor of the power switch, and the first ground signal is provided by one of the second voltage supply terminal or the third voltage supply terminal.

13. The DC-DC converter of claim 9, wherein:

during the auto-zero phase, the input signal switch couples a supply voltage to each of the first and second input signals of the current comparator, and during the compare phase, the input signal switch couples a voltage indicative of a predetermined maximum current allowed by a current rating of the inductor and the internal circuit node of the power switch to the first and second input signals of the current comparator, wherein the output of the current comparator indicates when a voltage on the internal circuit node reaches the voltage indicative of the predetermined maximum current.

14. The DC-DC converter of claim 13, further comprising:

a replica circuit configured to replicate the PMOS transistor and the first internal circuit node of the power switch to provide the voltage indicative of the predetermined maximum current to the input signal switch.

15. A current comparator, comprising:

a first capacitor having a first terminal coupled to a first input signal;

a second capacitor having a first terminal coupled to a second input signal;

a first transistor having a first current electrode coupled to a first voltage supply terminal via a first current source, a control electrode coupled to a second terminal of the first capacitor, and a second current electrode coupled to a first circuit node;

a second transistor having a first current electrode coupled to the first current electrode of the first transistor, a control electrode coupled to a second terminal of the second capacitor, and a second current electrode coupled to a second circuit node;

a third transistor having a first current electrode coupled to the first circuit node, a second current electrode coupled to a second voltage supply terminal, and a control electrode coupled to the first circuit node;

a fourth transistor having a first current electrode coupled to the second circuit node, a control electrode coupled to the control electrode of the third transistor, and a second current electrode coupled to the second voltage supply terminal; and a single-ended cascode amplifier having an input and an output, wherein the second circuit node is coupled to a first terminal of a third capacitor, and a second terminal of the third capacitor, different from the first terminal, is coupled to the input of the single-ended cascode amplifier;

wherein the current comparator is configured to operate in an auto-zero phase followed by a compare phase, wherein, during the auto-zero phase, the current comparator is configured to short the control electrode to the second current electrode of each of the first and second transistors, and during the compare phase, the current comparator is configured to not short the control electrode to the second current electrode of each of the first and second transistors;

wherein the single-ended cascode amplifier comprises:

a fifth transistor having a control electrode configured as the input of the single-ended cascode amplifier, a first current electrode coupled to the second voltage supply terminal, and a second current electrode, wherein the second terminal of the third capacitor is coupled to the control electrode of the fifth transistor; and a sixth transistor having a first current electrode coupled to the second current electrode of the fifth transistor, a control electrode, and a second current electrode coupled to the output of the single-ended cascode amplifier;

wherein the current comparator is further configured to:

during the auto-zero phase, short the control electrode of the fifth transistor to the second current electrode of the fifth transistor and short the control electrode of the sixth transistor to the second current electrode of the sixth transistor, and during the compare phase, not short the control electrode to the second current electrode of each of the fifth and sixth transistors.

16. The current comparator of claim 15, further comprising:

a logic stage coupled to receive the output of the single-ended cascode amplifier, and configured to provide an output of the current comparator.

17. A first DC-DC converter comprising:

the current comparator of claim 15;

a power switch having a PMOS transistor in series with an NMOS transistor, wherein an internal circuit node between the PMOS transistor and the NMOS transistor is configured to be coupled to an inductor, wherein:

during the auto-zero phase, a first ground signal is provided as each of the first and second input signals of the current comparator, and during the compare phase, a second internal circuit node of the power switch and a second ground signal are provided to the first and second input signals of the current comparator, wherein the output of the current comparator indicates when a voltage on the second internal circuit node reaches a voltage of the second ground signal.

18. A second DC-DC converter comprising:

the current comparator of claim 15;

a power switch having a PMOS transistor in series with an NMOS transistor, wherein an internal circuit node between the PMOS transistor and the NMOS transistor is configured to be coupled to an inductor, wherein:

during the auto-zero phase, a supply voltage is provided as each of the first and second input signals of the current comparator, and during the compare phase, a voltage indicative of a predetermined maximum current through the inductor and the internal circuit node are coupled to the first and second input signals of the current comparator, wherein the output of the current comparator indicates when a voltage on the internal circuit node reaches the voltage indicative of the predetermined maximum current.

* * * * *